United States Patent
Nishihata et al.

(10) Patent No.: US 10,797,569 B2
(45) Date of Patent: Oct. 6, 2020

(54) SEMICONDUCTOR DEVICE

(71) Applicant: DENSO CORPORATION, Kariya, Aichi-pref. (JP)

(72) Inventors: Masayoshi Nishihata, Kariya (JP); Nobumasa Ueda, Kariya (JP); Hiroki Kiyose, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/394,473

(22) Filed: Apr. 25, 2019

(65) Prior Publication Data
US 2019/0260274 A1    Aug. 22, 2019

Related U.S. Application Data

(63) Continuation of application No. PCT/JP2017/042498, filed on Nov. 28, 2017.

(30) Foreign Application Priority Data

Feb. 6, 2017    (JP) .................. 2017-019662

(51) Int. Cl.
| | |
|---|---|
| *H02K 11/33* | (2016.01) |
| *H01L 23/367* | (2006.01) |
| *H01L 23/50* | (2006.01) |
| *H01L 25/07* | (2006.01) |
| *H02K 3/50* | (2006.01) |
| *H02M 7/48* | (2007.01) |

(52) U.S. Cl.
CPC .......... *H02K 11/33* (2016.01); *H01L 23/3672* (2013.01); *H01L 23/50* (2013.01); *H01L 25/072* (2013.01); *H02K 3/50* (2013.01); *H02M 7/48* (2013.01); *H01L 23/367* (2013.01); *H02K 2203/09* (2013.01)

(58) Field of Classification Search
CPC ...... H02K 11/33; H02K 3/50; H02K 2203/09; H01L 23/367; H01L 23/50; H01L 25/07; H01L 23/49524; H01L 23/49562; H01L 25/072; H01L 23/49575; H01L 23/3672; H01L 2224/40247; H02M 7/48
USPC ............................................. 310/71, 89, 64
See application file for complete search history.

(56) References Cited

U.S. PATENT DOCUMENTS

| | | | |
|---|---|---|---|
| 2013/0141871 A1* | 6/2013 | Omae | H01L 24/37 361/709 |
| 2015/0130076 A1* | 5/2015 | Hino | H01L 24/84 257/774 |
| 2017/0186551 A1* | 6/2017 | Matsumoto | H01G 2/06 |

FOREIGN PATENT DOCUMENTS

| | | |
|---|---|---|
| JP | 4015634 B2 | 11/2007 |
| JP | 2011-166847 A | 8/2011 |
| WO | 2018/142735 A1 | 8/2018 |

\* cited by examiner

*Primary Examiner* — Naishadh N Desai
(74) *Attorney, Agent, or Firm* — Posz Law Group, PLC

(57) ABSTRACT

A semiconductor device includes: a plurality of control modules to control a rotating electric machine. The plurality of control modules are circularly arranged around a rotary shaft of the rotating electric machine. Each control module includes at least one switching element supplied with a current from a bus bar coupled to a power source. The at least one switching element in one of the control modules under a structural condition of arrangement has a lower resistance than another switching element.

7 Claims, 4 Drawing Sheets

US 10,797,569 B2

SEMICONDUCTOR DEVICE

CROSS REFERENCE TO RELATED APPLICATION

The present application is a continuation application of International Patent Application No. PCT/JP2017/042498 filed on Nov. 28, 2017, which designated the U.S. and claims the benefit of priority from Japanese Patent Application No. 2017-19662 filed on Feb. 6, 2017. The entire disclosures of all of the above applications are incorporated herein by reference.

TECHNICAL FIELD

The present disclosure relates to a semiconductor device including a plurality of control modules to control a rotating electric machine.

BACKGROUND

Recently, there is increasing use of a mechatronic rotating electric machine that integrally configures an actuator such as an alternator and a control apparatus to control the actuator. The mechatronic technology can improve control accuracy by combining outputs from the actuator and the control apparatus as modules and enable weight saving and easy installation by eliminating the wire harness. Meanwhile, the control apparatus needs to ensure operations despite the heat generated by itself and the heat from the actuator, requiring high thermal reliability.

SUMMARY

According to an example embodiment, a semiconductor device includes: a plurality of control modules to control a rotating electric machine. The plurality of control modules are circularly arranged around a rotary shaft of the rotating electric machine. Each control module includes at least one switching element supplied with a current from a bus bar coupled to a power source. The at least one switching element in one of the control modules under a structural condition of arrangement has a lower resistance than another switching element.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
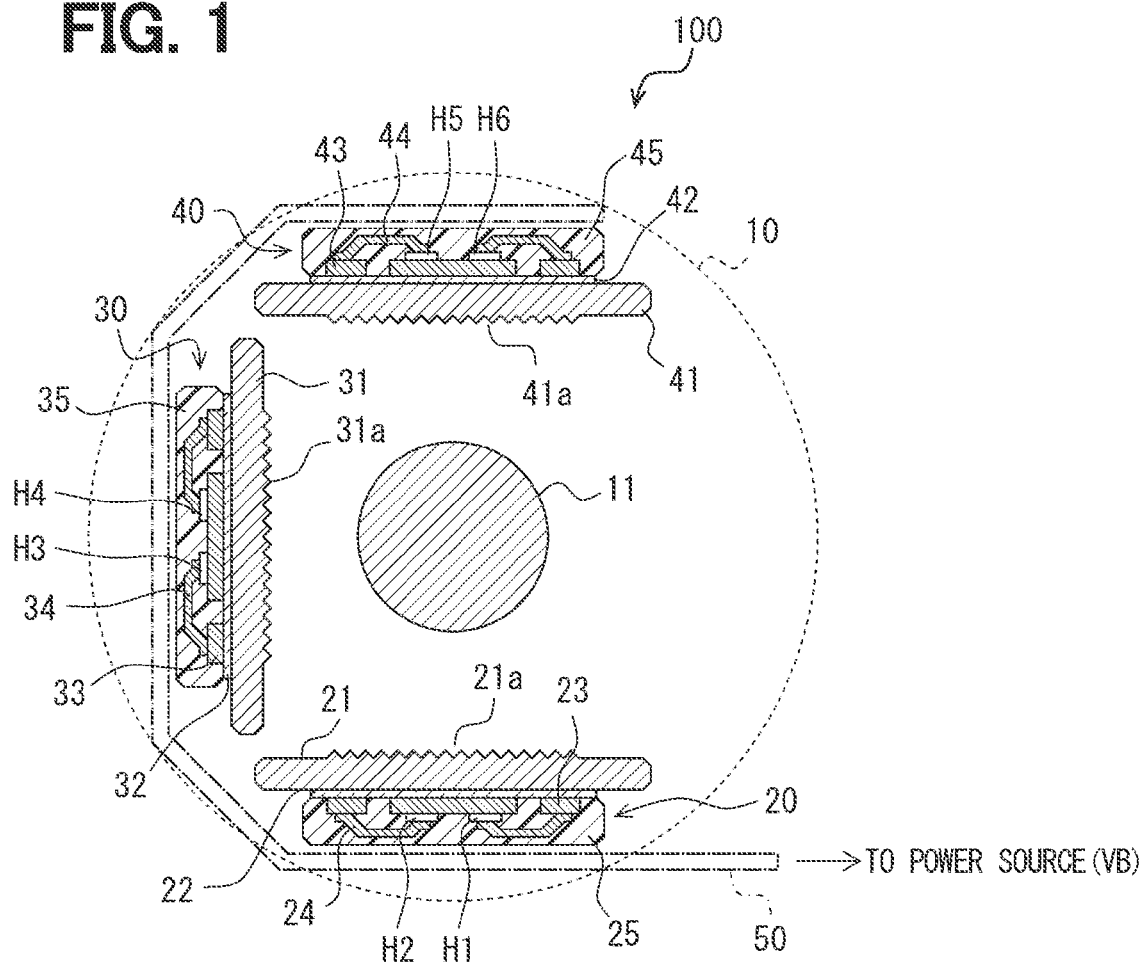
FIG. 1 is a cross-sectional plan view illustrating a schematic configuration of the semiconductor device according to a first embodiment.

For example, a vehicular rotating electric machine includes rectifier modules as control apparatuses circularly placed around a rotary shaft of a motor.

The configuration of circularly placing the modules as the control apparatuses around the rotary shaft of the rotating electric machine may use a mode of coupling each module to one circularly formed bus bar in order to supply a current to the module. This configuration includes a module coupled approximately to the current supply source and a module coupled far from the same. Viewed from the current supply source, approximating to the current supply source decreases a resistance value of the current pathway to each module including the bus bar.

Assuming that a power source for current supply is inadvertently coupled in a manner reverse to a normal coupling, a current flows through a switching element included in the module such as a parasitic diode of MOSFET. Each of the modules corresponding to a low resistance value increases the current. A large current flows through a low-resistance module placed approximately to the power source when eliminating factors such as heat radiation efficiency structures including a stage to mount the modules and the rotating electric machine. The parasitic diode of MOSFET indicates a negative temperature coefficient of resistance. A flow of high current increases the temperature and moreover promotes the resistance reduction. Increasing the current may cause positive feedback. This is unfavorable to the mechatronic semiconductor device.

It is, therefore, a semiconductor device capable of ensuring thermal reliability despite the reverse coupling to a power source is provided.

According to a first aspect of example embodiments, a semiconductor device includes: a plurality of control modules to control a rotating electric machine. The control modules are circularly arranged around a rotary shaft of the rotating electric machine. Each control module includes at least one switching element supplied with a current from a bus bar coupled to a power source. The plurality of control modules are electrically coupled in parallel to each other with respect to the bus bar coupled to the power source. The plurality of control modules are circularly arranged on a heat radiation plate having a C shape so as to surround the rotary shaft. The at least one switching element disposed in one of the control modules except two of the control modules arranged at two ends of the heat radiation plate has a lower resistance than another switching element.

As above, the heat radiation plate is shaped like the letter C, or a partially opened circle. In other words, this heat radiation plate includes edges in a circumferential direction. The edge has no heat radiation plate further and therefore provides lower heat radiation efficiency than the center in the circumferential direction.

Low resistances are assigned to switching elements belonging to the control modules except those provided for the two edges of the heat radiation plate. When a power source is inadvertently coupled reversely, a large current can be applied to the relevant or intended control module. The relevant control module is placed near the center of the heat radiation plate where the heat radiation efficiency is relatively high. This makes it possible to suppress a temperature rise due to the conduction. It is possible to ensure thermal reliability even when the power source is reversely coupled.

According to a second aspect of example embodiments, a semiconductor device includes: a plurality of control modules to control a rotating electric machine. The plurality of control modules are circularly arranged around a rotary shaft of the rotating electric machine. Each control module includes at least one switching element supplied with a current from a bus bar coupled to a power source. The at least one switching element in one of the control modules having a highest heat radiation efficiency under a structural condition of arrangement has a lower resistance than another switching element.

According to the above-described semiconductor device, low resistance is allocated to a switching element belonging to a control module that features structurally high heat radiation efficiency. When the power source is reversely coupled inadvertently, a large current can be applied to the relevant or intended control module. The relevant control module is given higher heat radiation efficiency than the other control modules, making it possible to suppress a temperature rise due to conduction. It is possible to ensure thermal reliability even when the power source is reversely coupled.

The description below explains a plurality of embodiments of the present disclosure with reference to the accompanying drawings. In each embodiment, the same parts or components corresponding to the preceding embodiment are depicted by the same reference symbols and duplicate description may be omitted for simplicity. When only part of a configuration is described in each embodiment, the remaining part of the configuration can reference the preceding embodiment already described. A combination is not limited to parts of each embodiment that are explicitly stated as being capable of the combination. Though not explicitly stated, it is also possible to partially combine the embodiments if the combination is not disadvantageous.

First Embodiment

Figure 2:
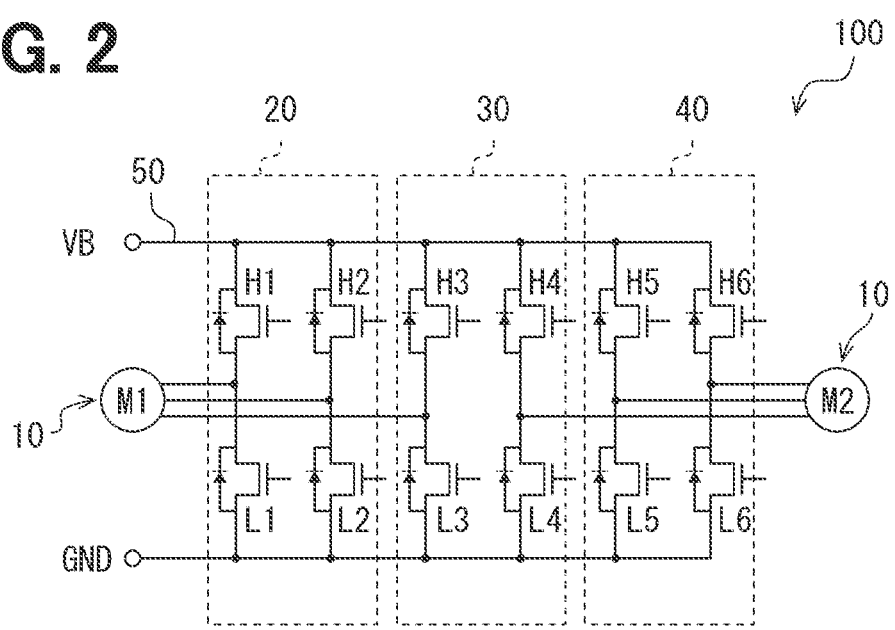
FIG. 2 is a diagram illustrating a circuit configuration of the semiconductor device.
Figure 3:
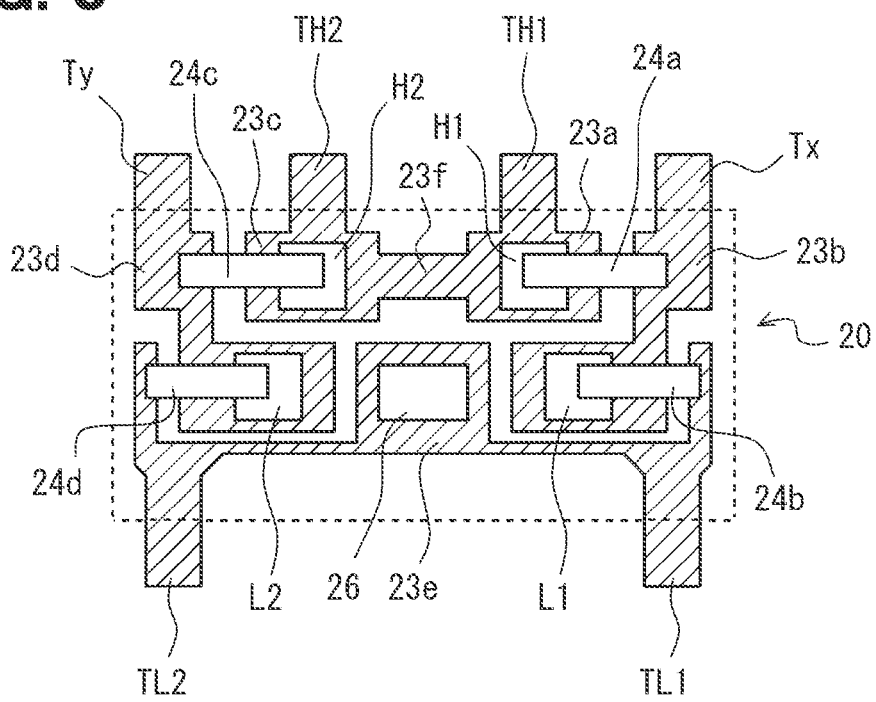
FIG. 3 is a diagram illustrating a detailed configuration of the control module.

With reference to FIGS. 1 through 3, the description below explains a schematic configuration of the semiconductor device according to the present embodiment.

The semiconductor device according to the present embodiment is provided as a mechatronic alternator that integrates the alternator as a rotating electric machine with a control module configuring a rectifier.

As illustrated in FIG. 1, a semiconductor device 100 includes an alternator 10, three control modules 20, 30, and 40, a bus bar 50, and heat radiation plates 21, 31, and 41. The alternator 10 includes a rotor and a stator that are not-shown. The control modules 20, 30, and 40 are placed so as to surround a rotary shaft 11 of the rotor of the alternator 10. The bus bar 50 couples with the control modules 20, 30, and 40. The control modules 20, 30, and 40 are placed on the heat radiation plates 21, 31, and 41.

As illustrated in FIG. 2, the alternator 10 includes the stator and the rotor. The stator includes two sets of 3-phase winding. The rotor includes a rotary shaft. The stator includes an not-shown iron core and stator windings M1 and M2. Specifically, the stator winding M1 is provided as a 3-phase winding including X, Y, and Z phases. The stator winding M2 is provided as a 3-phase winding including U, V, and W phases. The stator winding M2 is placed at an electric angle of 30 degrees shifted from the stator winding M1. The control modules 20, 30, and 40 are provided as rectifiers to control directions of current flow to the stator windings M1 and M2. A total of six arms control current flows to the X, Y, Z, U, V, and W phases.

One end of the bus bar 50 is coupled to the power source to supply a current to the control modules 20, 30, and 40. The control modules 20, 30, and 40 are coupled to the one bus bar 50. As illustrated in FIGS. 1 and 2, the control module 20, the control module 30, and the control module 40 are coupled in the order of vicinity to the power source. The control modules 20, 30, and 40 each function as an inverter and are coupled to the stator windings M1 and M2 configuring the stators.

With reference to FIGS. 1 through 3, the description below explains structures of the control modules 20, 30, and 40 in detail. FIG. 3, though not a sectional view, uses hatching to easily view the state of a metal plate 23.

As illustrated in FIG. 1, the control module 20 includes the metal plate 23, a bridge 24, and a sealing resin 25. The control module 20 includes four MOS transistors H1, L1, H2, and L2 as switching elements to configure an inverter. FIG. 1, as a sectional view, illustrates only H1 and H2 as MOS transistors belonging to the control module 20.

Similarly, the control module 30 includes a metal plate 33, a bridge 34, and a sealing resin 35. The control module 30 includes four MOS transistors H3, L3, H4, and L4 as switching elements to configure an inverter. Similarly, the control module 40 includes a metal plate 43, a bridge 44, and a sealing resin 45. The control module 40 includes four MOS transistors H5, L5, H6, and L6 as switching elements to configure an inverter.

The three control modules 20, 30, and 40 include composing elements comparable to each other except their physical arrangements and structures of the switching elements designed to intentionally use different resistance values. The one control module 20 is used as an example to explain the structure in detail.

As illustrated in FIG. 2, the control module 20 is assigned two of six arms and controls current supply to the X and Y phases. The control module 20 allows one arm to include a MOS transistor H1 at the high side and a MOS transistor L1 at the low side. These are serially coupled to power source VB. An intermediate point between the MOS transistor H1 and the MOS transistor L1 is coupled to the stator winding M1 to form the X phase. Similarly, the control module 20 allows another arm to include a MOS transistor H2 at the high side and a MOS transistor L2 at the low side. These are serially coupled to power source VB. An intermediate point between the MOS transistor H2 and the MOS transistor L2 is coupled to the stator winding M1 to form the Y phase. These arms are coupled to the power source in parallel.

The control module 20 is mounted as illustrated in FIG. 3 in order to provide the above-described coupling. The metal plate 23 includes a first metal plate 23a, a second metal plate 23b, a third metal plate 23c, a fourth metal plate 23d, and a fifth metal plate 23e. These are separately formed on the same plane. The bridge 24 includes a first bridge 24a, a second bridge 24b, a third bridge 24c, and a fourth bridge 24d.

The first metal plate 23a is mounted with the high-side MOS transistor H1 and is electrically coupled to a drain terminal. A terminal TH1 extends from the first metal plate 23a and is coupled to the bus bar 50.

The second metal plate 23b is mounted with the low-side MOS transistor L1 and is electrically coupled to a drain terminal and is coupled to a source terminal of the high-side MOS transistor H1 via the first bridge 24a. A terminal Tx extends from the second metal plate 23b and is coupled to the stator winding M1.

The third metal plate 23c is mounted with the high-side MOS transistor H2 and is electrically coupled to a drain terminal. A terminal TH2 extends from the third metal plate 23c and is coupled to the bus bar 50.

The fourth metal plate 23d is mounted with the low-side MOS transistor L2 and is electrically coupled to a drain terminal and is coupled to a source terminal of the high-side MOS transistor H2 via the third bridge 23c. A terminal Ty extends from the fourth metal plate 23d and is coupled to the stator winding M1.

The fifth metal plate 23e is coupled to a source terminal of the MOS transistor L1 via the second bridge 24b and is coupled to a source terminal of the MOS transistor L2 via the fourth bridge 24b. Terminals TL1 and TL2 are led out of the fifth metal plate 23a and are coupled to the bus bar set to the GND potential. The fifth metal plate 23e is mounted with a control IC 26 to control switching over the MOS transistors H1, H2, L1, and L2. Though not illustrated in FIG. 3, the control IC 26 is coupled to the MOS transistors H1, H2, L1, and L2 by using bonding wires. In the control module 20, the metal plate 23, the bridge 24, and the MOS transistors H1, H2, L1, and L2 are placed so as to be approximately bilaterally symmetric on an arm basis.

According to the present embodiment, the first metal plate 23a and the third metal plate 23c are coupled to each other via the coupling plate 23f. Namely, the first metal plate 23a, the third metal plate 23c, and the coupling plate 23f are formed into an integrated plate. The coupling plate 23f provides thermal coupling between the first metal plate 23a and the third metal plate 23c. When one of the high-side MOS transistors H1 and H2 is heated excessively, the heat is transferred to the metal plate where the other MOS transistor is mounted.

The sealing resin 25 seals the MOS transistors H1, H2, L1, and L2, and the metal plate 23 so as to cover them. One surface of the metal plate 23 is not mounted with the MOS transistors H1, H2, L1, and L2 and is exposed from the sealing resin 25. The control module 20 is placed over the heat radiation plate 21 via an insulation layer 22 so that one surface of the metal plate 23 exposed from the sealing resin 25 faces the heat radiation plate 21. The heat generated from the MOS transistors H1, H2, L1, and L2 transfers and dissipates to the heat radiation plate 21 via the metal plate 23 and the insulation layer 22. A radiation fin 21a is formed over the surface that is not mounted with the control module 20 in the heat radiation plate 21.

As above, the control module 30 also includes composing elements similar to those of the control module 20. Namely, the metal plate 33 divided into fifths is appropriately mounted with the high-side MOS transistors H3 and H4, the low-side MOS transistors L3 and L4, and the control IC. The arm comprised of the MOS transistors H3 and L3 provides a Z phase for the stator winding M1. The arm comprised of the MOS transistors H4 and L4 provides a U phase for the stator winding M2. A heat radiation plate 31 includes a radiation fin 31a.

The control module 40 also includes composing elements similar to those of the control module 20. Namely, the metal plate 43 divided into fifths is appropriately mounted with the high-side MOS transistors H5 and H6, the low-side MOS transistors L5 and L6, and the control IC. The arm comprised of the MOS transistors H5 and L5 provides a V phase for the stator winding M2. The arm comprised of the MOS transistors H6 and L6 provides a W phase for the stator winding M2. A heat radiation plate 41 includes a radiation fin 41a.

As illustrated in FIG. 1, the control modules 20, 30, and 40 are circularly placed so as to surround the rotary shaft 11. The control modules 20, 30, and 40 are placed so that the surfaces to mount the heat radiation plates 21, 31, and 41 are aligned in the rotary shaft direction. The heat radiation plate 21 and the heat radiation plate 41 are placed so that the radiation fin 21a and the radiation fin 41a face to each other. The heat radiation plate 31 is placed to be orthogonal to the heat radiation plate 21 and the heat radiation plate 41. Namely, the heat radiation plates 21, 31, and 41 are circularly placed so that the radiation fins face the rotary shaft 11. The control modules 20, 30, and 40 adhere to the surfaces where no radiation fin is formed. In this mode, terminals extending from the metal plates 23, 33, and 43 are placed in a U-shaped form. Therefore, the bus bar 50 is also bent into a U-shaped form.

Though not illustrated, the semiconductor device 100 uses air cooling (or water cooling) to cool the control modules 20, 30, and 40. The control modules 20, 30, and 40 indicate different heat dissipations according to heat generation situations or temperature distributions resulting from the structure of the alternator 10 or structural conditions such as positions to place the heat radiation plates 21, 31, and 41. The heat dissipation can be represented by the magnitude of thermal resistance. A large thermal resistance makes the heat release difficult and causes low heat dissipation. The heat dissipation can be estimated by performing heat transfer simulation under a specified structural condition. For example, a simulation or an experiment can previously acquire the heat dissipation of the semiconductor device 100 that is mounted on a vehicle and is used for normal operation. The present embodiment assumes that the control module 30 features the highest heat dissipation, for example.

Under this structural condition, at least one of the four MOS transistors H3, H4, L3, and L4 belonging to the control module 30 is assigned a resistance value for conduction that is smaller than resistance values of the other MOS transistors.

For example, a resistance value of the MOS transistor H3 is smaller than those of H1, H2, H4, H5, H6, L1, L2, L3, L4, L5, and L6. As another example, resistance values of the MOS transistors H3 and L4 are smaller than those of H1, H2, H4, H5, H6, L1, L2, L3, L5, and L6. This allows the resistance value of the control module 30 for conduction to be smaller than resistance values of the control modules 20 and 40.

The resistance of the MOS transistor can be reduced by increasing an area of an effective cell region where a drain current flows through. Concerning a trench-type MOS transistor, for example, the effective cell region forms one surface of a semiconductor substrate, exposes a source region, applies a voltage to the trench gate to generate a channel, and contributes to conduction of a drain current. Increasing the effective cell region decreases the resistance value of the MOS transistor.

For example, it is supposed that the resistance value of the MOS transistor H3 is smaller than those of H1, H2, H4, H5, H6, L1, L2, L3, L4, L5, and L6. This signifies that the effective cell region for the MOS transistor H3 occupies a larger area than H1, H2, H4, H5, H6, L1, L2, L3, L4, L5, and L6.

The description below explains operations and effects of using the semiconductor device 100 according to the present embodiment.

For example, it is supposed that the power source is reversely coupled to the semiconductor device 100. Namely, it is supposed that the bus bar originally configured to be a GND potential goes to a higher potential than the bus bar 50 originally configured to be a VB potential.

As illustrated in FIG. 2, a parasitic diode occurs in the MOS transistor in the forward direction from the source terminal to the drain terminal. If the power source is reversely coupled, a current flows via the parasitic diode. Namely, the current flows from the low-side MOS transistor to the high-side MOS transistor. This current heats the MOS transistor. The parasitic diode has a negative temperature coefficient of resistance. Heat generation further promotes resistance reduction. Therefore, more current flows to increase the amount of heat generation.

The control module 30 according to the present embodiment has a smaller resistance value than those of the control modules 20 and 40. Therefore, the reverse coupling causes the largest current to flow through the control module 30. As above, the control module 30 is heated. However, the control module 30 is restrained from increasing the temperature because the control module 30 remains in the structural condition that provides higher heat dissipation than that of the control modules 20 and 40. This makes it possible to restrain the control module 30 from increasing the temperature. It is possible to prevent the control module 30 from encountering thermal runaway and ensure the time until activating a fail-safe function against the reverse coupling, for example.

For example, resistance values of the MOS transistors H3 and L3 may be configured to be smaller than those of H1, H2, H4, H5, H6, L1, L2, L4, L5, and L6. A current due to the reverse coupling can be positively applied to the relevant arm by decreasing resistance values of the high-side and low-side MOS transistors configuring the same arm. This makes it possible to improve the thermal reliability of arms other than the relevant arm.

The control module 30 according to the present embodiment uses the coupling plate to thermally couple the metal plate 33 mounted with the MOS transistor H3 and the metal plate 33 mounted with the MOS transistor H4. The heat generation from the MOS transistor H3 also increases the temperature of the MOS transistor H4 and decreases the resistance value. This enables the MOS transistor H3 and the MOS transistor H4 to share the current, making it possible to restrain excessive heat generation in the MOS transistor H3 that is intentionally configured to let a large current to flow through.

First Modification

Figure 4:
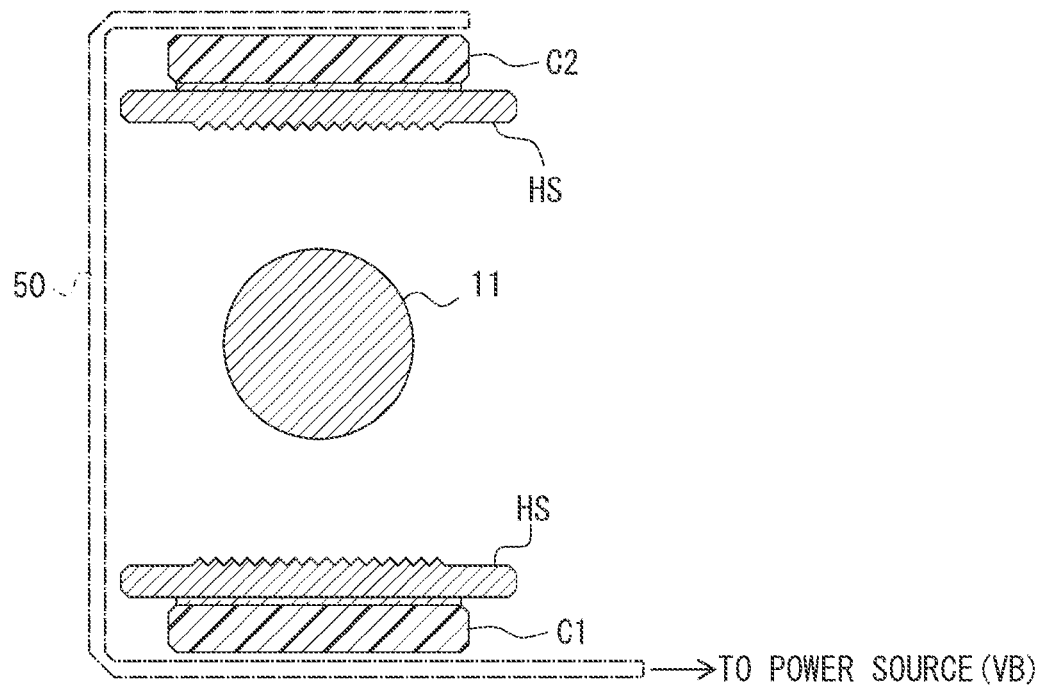
FIG. 4 is a cross-sectional plan view illustrating a schematic configuration of the semiconductor device according to a first modification.
Figure 5:
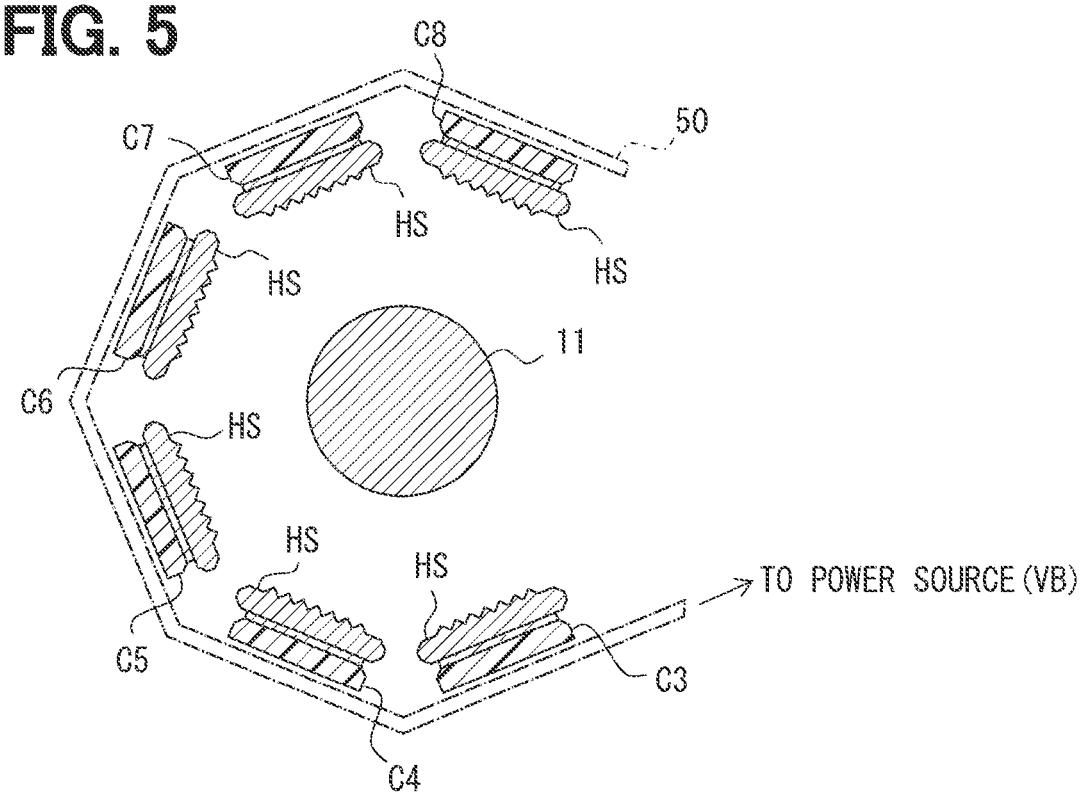
FIG. 5 is a cross-sectional plan view illustrating a schematic configuration of the semiconductor device according to the first modification.

There has been described the example of 4in1-configuration modules such as the control modules 20, 30, and 40 each including four MOS transistors. However, the same effect is applicable to a semiconductor device including a plurality of control modules. Specifically, the effect is also applicable to a semiconductor device that uses two 6in1-configuration control modules to control six phases or uses six 2in1-configuration control modules to control six phases. The 6in1-configuration control module is comprised of one control module that includes six MOS transistors. As illustrated in FIG. 4, two control modules C1 and C2 are bonded to heat radiation plates HS and are placed so as to sandwich a rotary shaft 11. The 2in1-configuration control module is comprised of one control module that includes two MOS transistors. As illustrated in FIG. 5, six control modules C3 through C8 are bonded to heat radiation plates HS and are placed so as to surround the rotary shaft 11. Even in these configurations, any one of the control modules indicating the highest heat dissipation includes at least one switching element assigned a resistance lower than the other switching elements under the structural condition such as being placed. This makes it possible to intentionally apply a large current to a specified control module when using the reversely coupled power source and restrain the control module from increasing the temperature because the control module features high heat dissipation.

Second Embodiment

The first embodiment has described the example of mounting the control modules on the discrete heat radiation plates. The second embodiment will describe an example of mounting the control modules on one integrally concatenated heat radiation plate. The example of the present embodiment uses a semiconductor device 200 including six 2in1-configuration control modules each of which includes two MOS transistors.

Figure 6:
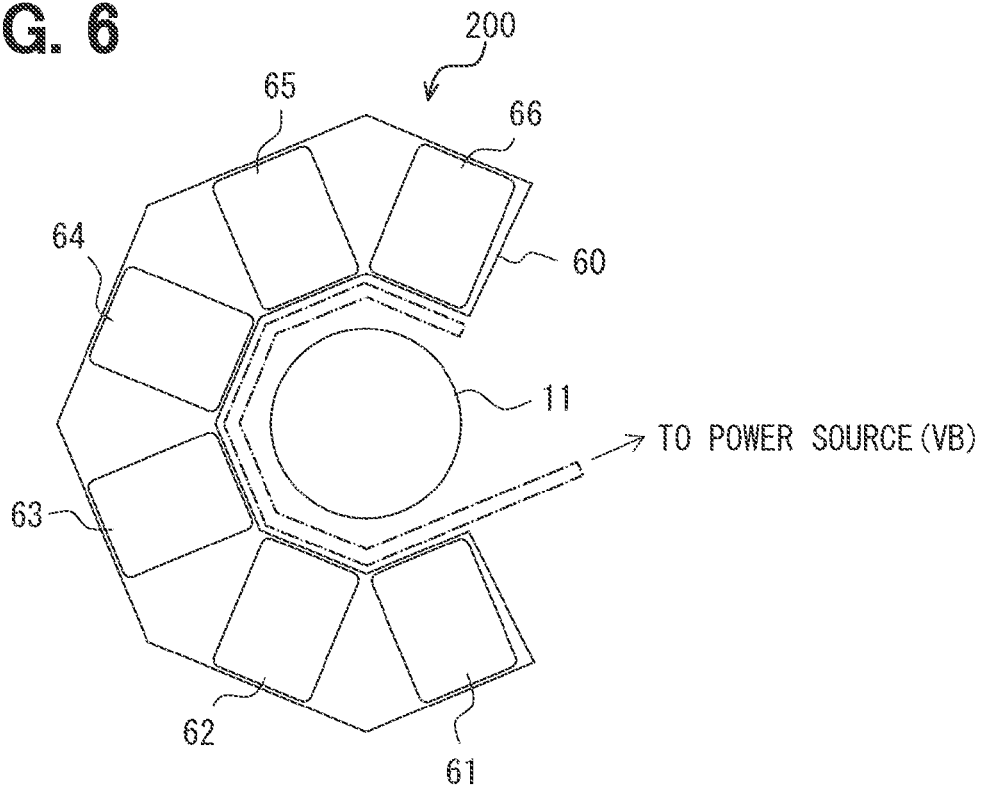
FIG. 6 is a plan view illustrating a schematic configuration of the semiconductor device according to a second embodiment.

As illustrated in FIG. 6, the semiconductor device 200 includes an alternator (only the rotary shaft 11 illustrated in FIG. 6), a heat radiation plate 60, control modules 61 through 66, and a bus bar 50. The heat radiation plate 60 is shaped like the letter C so as to surround the rotary shaft 11. The control modules 61 through 66 are placed on the heat radiation plate 60 so as to surround the rotary shaft 11 along a direction of extending the heat radiation plate 60. The bus bar 50 couples with the control modules 61 through 66.

The alternator is similar to the alternator 10 according to the first embodiment. Namely, the alternator is comprised of a stator and a rotor. The stator includes two sets of 3-phase windings. The rotor includes a rotary shaft. The stator is comprised of an not-shown stator iron core and stator windings M1 and M2. Specifically, the stator winding M1 is provided as a 3-phase winding comprised of H, Y, and Z phases. The stator winding M2 is provided as a 3-phase winding comprised of U, V, and W phases. The stator winding M2 is placed at an electric angle of 30 degrees shifted from the stator winding M1. The control modules 61 through 66 are provided as rectifiers to control directions of current flow to the stator windings M1 and M2. One control module corresponds to one arm. A total of six arms control current flows to the X, Y, Z, U, V, and W phases.

The heat radiation plate 60 is a metal plate shaped like the letter C so as to surround the rotary shaft 11. The heat radiation plate 60 according to the present embodiment is placed opposite the alternator in the axis direction of the rotary shaft 11. An not-shown radiation fin is formed on a plane opposite the alternator of the heat radiation plate 60.

The control modules 61 through 66 are successively placed on a plane opposite the plane to form the radiation fin. The control modules 61 through 66 are parallel coupled to the bus bar 50 coupled to the power source and are successively placed in the order of the control modules 61, 62, 63, 64, 65, and 66 starting from the one nearest to the power source. The control module 61 is plated at one edge of the heat radiation plate 60. The control module 66 is plated at the other edge of the heat radiation plate 60.

Compared with FIG. 2, the control module 61 includes the high-side MOS transistor H1 and the low-side MOS transistor L1. The control module 62 includes the high-side MOS transistor H2 and the low-side MOS transistor L2. The control module 63 includes the high-side MOS transistor H3 and the low-side MOS transistor L3. The control module 64 includes the high-side MOS transistor H4 and the low-side MOS transistor L4. The control module 65 includes the high-side MOS transistor H5 and the low-side MOS transistor L5. The control module 66 includes the high-side MOS transistor H6 and the low-side MOS transistor L6.

The bus bar 50 is formed along the shape of the heat radiation plate 60. According to the present embodiment, the bus bar 50 is placed along the inner surface of the heat radiation plate 60 in a region between the rotary shaft 11 and the heat radiation plate 60. The control modules 61 through 66 are radially placed by directing the high-side power source terminals toward the rotary shaft 11.

The semiconductor device 200 allows at least one of the MOS transistors H2 through H5 and L2 through L5 to have a lower resistance than the other MOS transistors when the MOS transistors H2 through H5 and L2 through L5 configure the control modules 62 through 65 except the control modules 61 and 66 placed at the edges of the heat radiation plate 60.

For example, the resistance value of the MOS transistor H3 is smaller than those of H1, H2, H4, H5, H6, L1, L2, L3, L4, L5, and L6. This allows the resistance value of the control module 63 for conduction to be smaller than the resistance values of the control modules 61, 62, 64, 65, and 66. As another example, the resistance values of the MOS transistors H4 and L4 are smaller than those of H1, H2, H3, H5, H6, L1, L2, L3, L5, and L6. This allows the resistance value of the control module 64 for conduction to be smaller than the resistance values of the control modules 61, 62, 63, 65, and 66. The resistance of the MOS transistor can be reduced by increasing the area of an effective cell region where a drain current flows, for example. The area of an effective cell is described in the first embodiment.

The description below explains an operation and effect by using the semiconductor device 200 according to the present embodiment.

The semiconductor device 200 according to the present embodiment includes the control modules 61 through 66 that are successively placed along the formation of the integrally configured heat radiation plate 60. The vicinity of the edge of the heat radiation plate 60 provides no further thermal bridge and therefore causes lower heat dissipation than the center. In other words, the vicinity of the center of the heat radiation plate 60 causes higher heat dissipation than the vicinity of the edge.

The semiconductor device 200 uses a low resistance for at least one of the MOS transistors H2 through H5 and L2 through L5 configuring the control modules 62 through 65 except the control modules 61 and 66 positioned at the edges of the heat radiation plate 60. This makes it possible to provide the control module to which that MOS transistor belongs with a lower resistance than the other control modules.

For example, it is supposed that the power source is reversely coupled to the semiconductor device 100. Namely, it is supposed that the bus bar originally configured to be a GND potential goes to a higher potential than the bus bar 50 originally configured to be a VB potential. In this case, a current caused by a reversely coupled power source flows through the parasitic diode similarly to the first embodiment.

According to the example, the resistance value of the MOS transistor H3 is smaller than those of H1, H2, H4, H5, H6, L1, L2, L3, L4, L5, and L6. This allows the resistance value of the control module 63 for conduction to be smaller than the resistance values of the control modules 61, 62, 64, 65, and 66. A current positively flows through the control module 63. However, the control module 63 is placed at the position of the heat radiation plate 60 corresponding to the high heat dissipation and can, therefore, suppress a temperature increase due to the current.

According to the other example, the resistance values of the MOS transistors H4 and L4 are smaller than those of H1, H2, H3, H5, H6, L1, L2, L3, L5, and L6. This allows the resistance value of the control module 64 for conduction to be smaller than the resistance values of the control modules 61, 62, 63, 65, and 66. A current positively flows through the control module 64. However, the control module 64 is placed at the position of the heat radiation plate 60 corresponding to the high heat dissipation and can, therefore, suppress a temperature increase due to the current.

The resistance reduction may be applied to not only the control module 63 or 64 but also the control module 62 or 65. However, it is favorable to apply the resistance reduction to the control module 63 or 64 nearer to the center of the heat radiation plate 60. The resistance reduction may be applied to not only one control module but also the control modules 63 and 62.

It is favorable to select a control module for resistance reduction so that the control module corresponds to the highest heat dissipation out of the other control modules. This makes it possible to restrain a temperature increase in the control module where a large current is intentionally applied due to the resistance reduction. It is possible to prevent thermal runaway in the relevant control module and ensure the time until activating a fail-safe function against the reverse coupling, for example.

Second Modification

Figure 7:
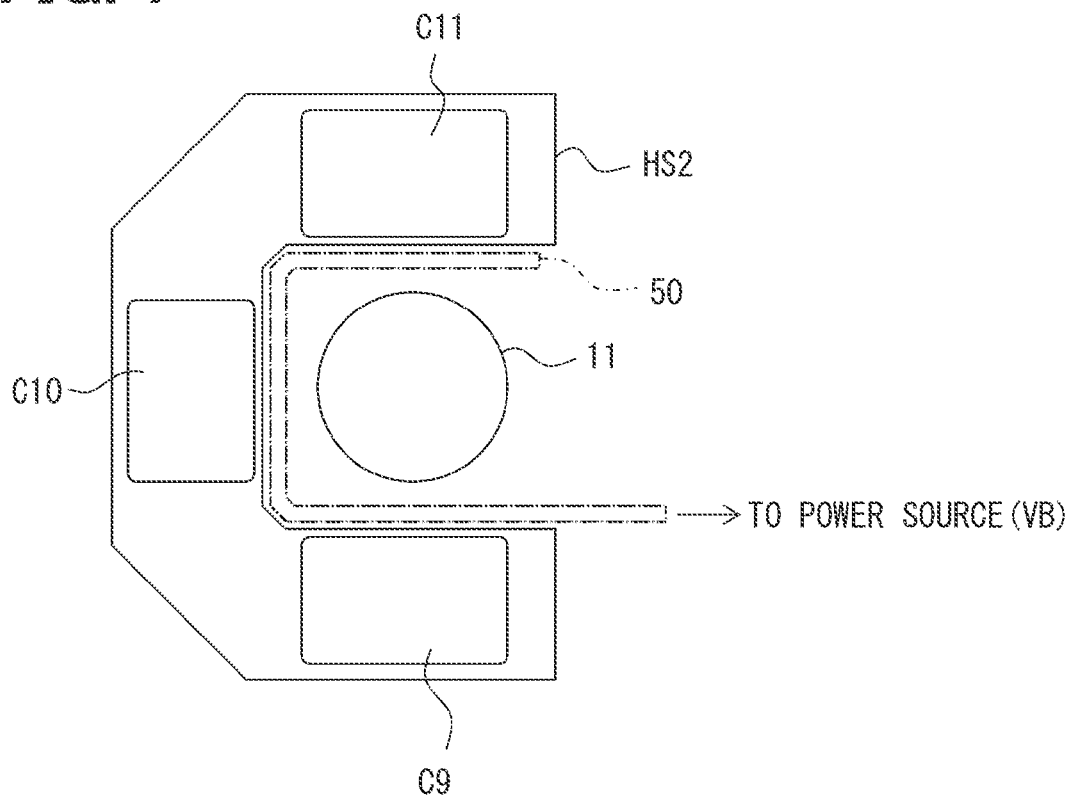
FIG. 7 is a plan view illustrating a schematic configuration of the semiconductor device according to a second modification.

The above-described example has explained the 2in1-configuration modules in which the control modules 61 through 66 each include two MOS transistors. However, the same effect is applicable to a semiconductor device including three or more control modules successively placed on an integrally formed heat radiation plate. Specifically, the effect is applicable to a semiconductor device that allows three 4in1-configuration control modules to control six phases. As illustrated in FIG. 7, for example, three control modules C9 through C11 are bonded to a heat radiation plate HS2 and are placed so as to surround the rotary shaft 11. This mode applies resistance reduction to the control module C10 that is not positioned at the edges of the heat radiation plate HS2. This makes it possible to intentionally apply a large current to the control module C10 when using the reversely coupled power source and restrain the control module C10 from increasing the temperature because the control module C10 provides higher heat dissipation than the control modules C9 and C11.

Other Embodiments

There have been described the preferred embodiments of the present disclosure. However, the disclosure is not limited to the above-mentioned embodiments but may be otherwise variously modified within the spirit and scope disclosed in this specification.

The above-described embodiments and modifications have described examples of using the MOS transistor as a switching element included in the control module. However, the switching element may be available as an insulated gate bipolar transistor (IGBT) or other semiconductor switching elements.

The above-described embodiments and modifications have described examples of using the 3-phase winding for the stator windings M1 and M2. However, the number of phases is not limited. Accordingly, the number of control modules needs to be changed as appropriate.

The above-described embodiments and modifications have explained the resistance reduction by increasing the area of the effective cell region of the switching element as a technique for reducing the resistance of the control module. However, the resistance reduction technique is not limited thereto. For example, the resistance reduction may be provided by changing a constituent material of the metal plates 23, 33, and 43 or changing components of an electrically conductive adhesive (such as solder) used for electrical coupling. However, changing the area of the effective cell region of the switching element is easier and more effective for the resistance reduction than changing a constituent material of the metal plates 23, 33, and 43 or changing components of an electrically conductive adhesive.

Figure 8:
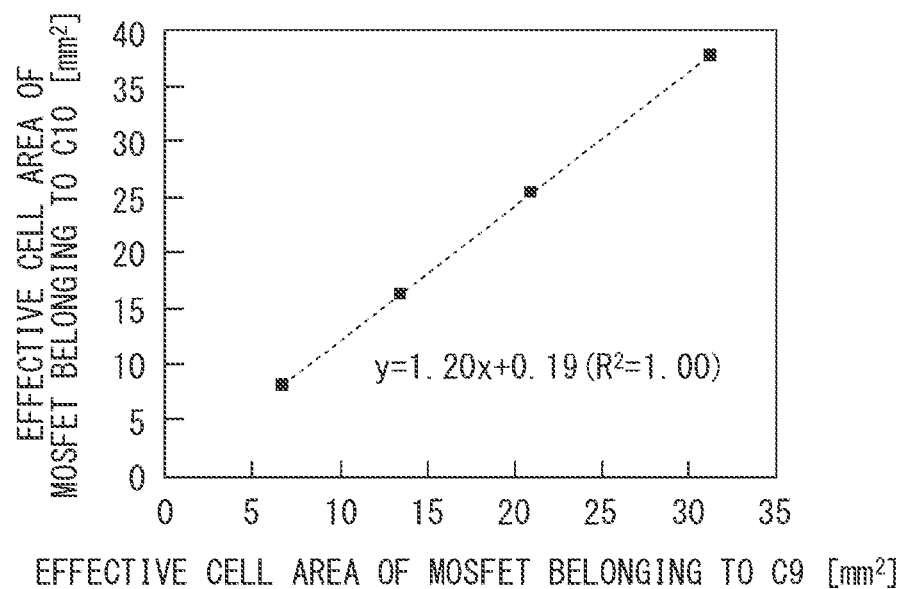
FIG. 8 is a diagram illustrating a relationship between areas of effective cell regions in MOS transistors in terms of resistance reduction.

The inventors examined area sizes of the effective cell region of a MOS transistor subject to resistance reduction in comparison with a MOS transistor free from resistance reduction. FIG. 8 illustrates a result of a computer simulation performed under the condition of the same heat dissipation according to the mode described in the second modification with reference to FIG. 7. The simulation assumes 50 µΩ to be a resistance value due to the bus bar 50 between the adjacent control modules C9 an C10, 75 mΩ to be a wiring resistance of the entire circuit, and 14 V to be a potential difference applied to the control module when the power source is reversely coupled. FIG. 8 illustrates the result of finding areas of the MOS transistor in the control module C10 in order to cause the same amount of heat generation as the control module C9 in comparison with areas of the MOS transistor configuring the control module C9. Between the adjacent control modules, configuring the area of the MOS transistor farther from the power source approximately 1.2 times larger than the other can maintain approximately the same current value during the reverse coupling. The MOS transistor for the control module capable of the high heat dissipation favorably requires an area at least 1.2 times larger.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a plurality of control modules to control a rotating electric machine, wherein:
   the control modules are circularly arranged around a rotary shaft of the rotating electric machine;
   each control module includes at least one switching element supplied with a current from a bus bar coupled to a power source;
   the plurality of control modules are electrically coupled in parallel to each other with respect to the bus bar coupled to the power source;
   the plurality of control modules are circularly arranged on a heat radiation plate having a C shape so as to surround the rotary shaft; and
   the at least one switching element disposed in one of the control modules except two of the control modules arranged at two ends of the heat radiation plate has a lower resistance than another switching element.

2. The semiconductor device according to claim 1, wherein:
   the one of the control modules in which the at least one switching element having the lower resistance is disposed has a highest heat radiation efficiency under a structural condition of arrangement.

3. The semiconductor device according to claim 1, wherein:
   each control module is an inverter; and
   the one of the control modules, in which the at least one switching element having the lower resistance is disposed, includes a low side switching element and a high side switching element each of which has the lower resistance.

4. The semiconductor device according to claim 1, wherein:
   the at least one switching element having the lower resistance is a MOSFET; and
   the at least one switching element having the lower resistance than another switching element has an area of an effective cell region through which a drain current flows, the area being larger than another switching element.

5. A semiconductor device comprising:
   a plurality of control modules to control a rotating electric machine, wherein:
   the plurality of control modules are circularly arranged around a rotary shaft of the rotating electric machine;
   each control module includes at least one switching element supplied with a current from a bus bar coupled to a power source; and
   the at least one switching element in one of the control modules having a highest heat radiation efficiency under a structural condition of arrangement has a lower resistance than another switching element.

6. The semiconductor device according to claim 5, wherein:
   each control module is an inverter; and
   the one of the control modules, in which the at least one switching element having the lower resistance is disposed, includes a low side switching element and a high side switching element each of which has the lower resistance.

7. The semiconductor device according to claim 5, wherein:
   the at least one switching element having the lower resistance is a MOSFET; and
   the at least one switching element having the lower resistance than another switching element has an area of an effective cell region through which a drain current flows, the area being larger than another switching element.

* * * * *